(12) United States Patent
Lu et al.

(10) Patent No.: US 7,471,893 B2
(45) Date of Patent: Dec. 30, 2008

(54) DIGITAL CAMERA

(75) Inventors: Jiun-Nan Lu, Taipei (TW); Chien-Kuo Hsu, Taipei (TW); Chih-Hsiang Tsai, Taipei (TW)

(73) Assignee: Premier Image Technology Corporation, Taipei (TW)

( * ) Notice: Subject to any disclaimer, the term of this patent is extended or adjusted under 35 U.S.C. 154(b) by 368 days.

(21) Appl. No.: 11/367,366

(22) Filed: Mar. 6, 2006

(65) Prior Publication Data
US 2007/0127915 A1    Jun. 7, 2007

(30) Foreign Application Priority Data
Dec. 2, 2005    (TW) ............................. 94142630 A

(51) Int. Cl.
G03B 17/00    (2006.01)
G03B 13/00    (2006.01)
H04N 5/232    (2006.01)

(52) U.S. Cl. ..................................... 396/542; 348/374

(58) Field of Classification Search .................. 396/72, 396/79, 83, 349, 451, 453, 454, 348, 532, 396/542, 439, 535, 275, 6; 359/676, 694, 359/696, 699, 703, 704, 817; 348/335, 340, 348/345, 357, 373–376
See application file for complete search history.

(56) References Cited

U.S. PATENT DOCUMENTS 6,476,417 B2 *    11/2002    Honda et al. .................. 257/59

* cited by examiner

Primary Examiner—Reena Aurora
(74) Attorney, Agent, or Firm—Bacon & Thomas, PLLC

(57) ABSTRACT

A digital camera has a printed circuit board which comprises a main area and a flexible area. An optical sensor chip (e.g. a CCD) is fixed onto the flexible area. The flexible area has flexible character relative to the main area. Therefore, even if the printed circuit board is stressed, such stress will be almost or completely eliminated in the flexible area, so that the optical sensor chip and an optical lens can be coupled together in a precise manner.

14 Claims, 8 Drawing Sheets

DIGITAL CAMERA

BACKGROUND OF THE INVENTION

1. Field of the Invention

The present invention relates to digital cameras, and, more particularly, to circuit boards used in digital cameras.

2. Description of the Related Art

One of the most important things for the manufacturing process of a digital camera is ensuring that the optical lens set and the optical sensor chip (such as charge coupled device, CCD) are perfectly parallel with each other.

Please refer to FIG. 1. FIG. 1 shows a first method of combining an optical lens set and an optical sensor chip together in a prior art prior art digital camera. The optical sensor chip 81 is fixed onto a smaller circuit board 82, and the optical lens set 80 is combined with the optical sensor chip 81. The smaller circuit board 82 is then connected to a primary circuit board (not shown) via a flexible circuit board 83. The primary circuit board is therefore not directly connected to the optical sensor chip 81, and so both during and after the assembly process, the primary circuit board does not transmit stress to the smaller circuit board 82, and the optical sensor chip 81 is also not affected by stress from the primary circuit board.

Please refer to FIG. 2. FIG. 2 shows a second method of combining an optical lens set and an optical sensor chip together in a prior art digital camera. The optical sensor chip 91 is fixed on a flexible circuit board 93, and the flexible circuit board 93 is connected to the primary circuit board (not shown). Stress from the primary circuit board is therefore not transferred to the optical sensor chip 91, and so the optical sensor chip 91 may be precisely aligned with the optical lens set 90.

However, the above-mentioned methods increase the volume of the mentioned parts, the number of the parts, the number of assembly steps and product costs. Therefore, it is desirable to provide a digital camera with a circuit board to mitigate and/or obviate the aforementioned problems.

SUMMARY OF THE INVENTION

The main objective of the present invention is to provide a digital camera that can solve the above-mentioned problem. In this digital camera, the optical sensor chip is directly combined with the main circuit board, and the optical sensor chip can be precisely aligned with the optical lens set, and the volume and the number of the parts, the number of assembly steps and product costs can be reduced.

The digital camera of the present invention has a printed circuit board which comprises a main area and a flexible area. An optical sensor chip (e.g. a CCD) is fixed onto the flexible area. The flexible area has flexible character relative to the main area. Therefore, even if the printed circuit board is stressed, such stress will be almost or completely eliminated in the flexible area, so that the optical sensor chip and an optical lens can be coupled together in a precise manner.

According to the embodiments of the present invention, there are two symmetric slots on the circuit board, and the flexible area can be connected to the main area via two connecting areas. The two slots surround from 60% up to 97% of the periphery of the flexible area, and the two of connecting areas surround from 40% down to 3% of the periphery of the flexible area.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
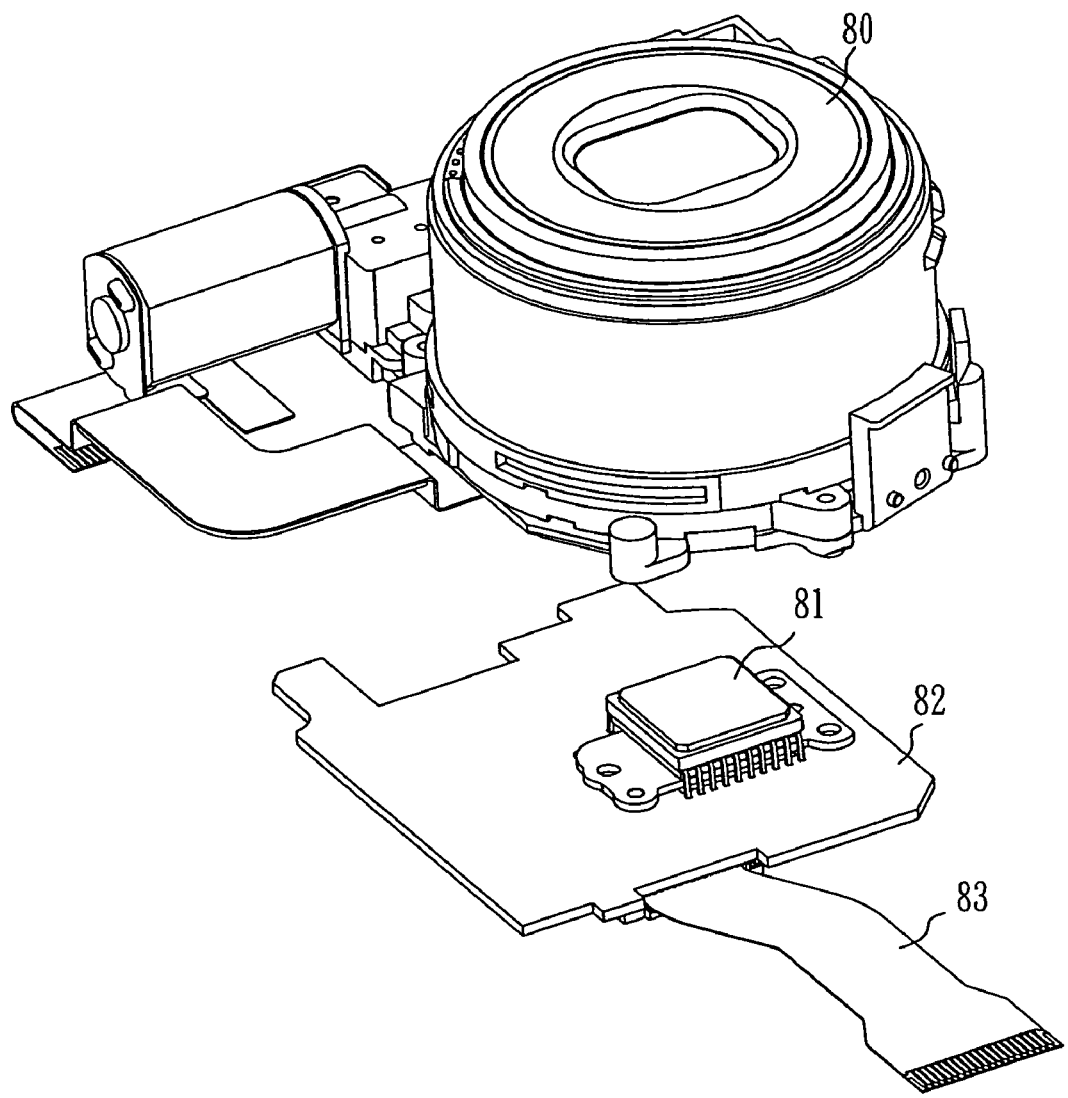
FIG. 1 shows a first method of combining together an optical lens set and an optical sensor chip in a prior art digital camera.
Figure 2:
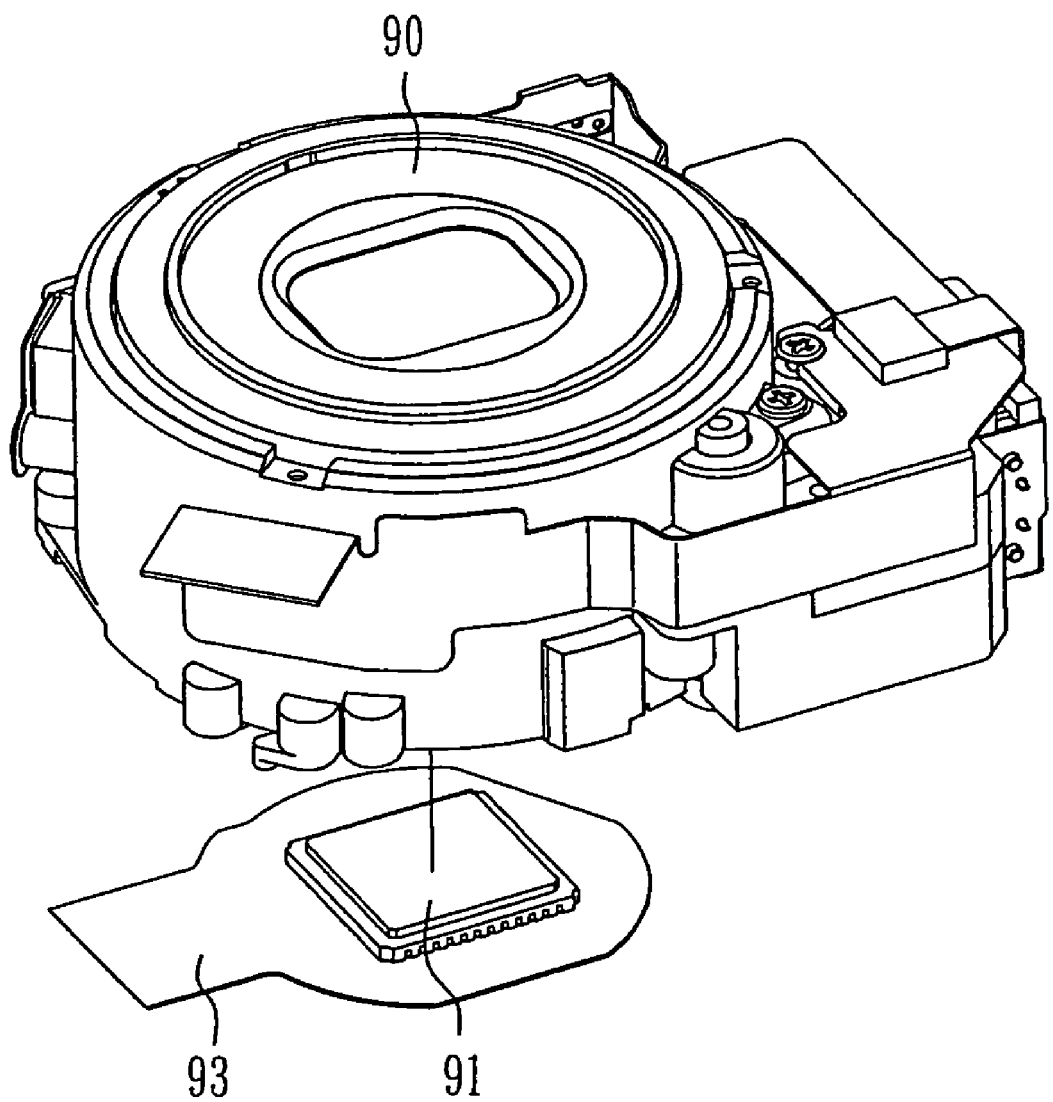
FIG. 2 shows a second method of combining together an optical lens set and an optical sensor chip in another prior art digital camera.
Figure 3:
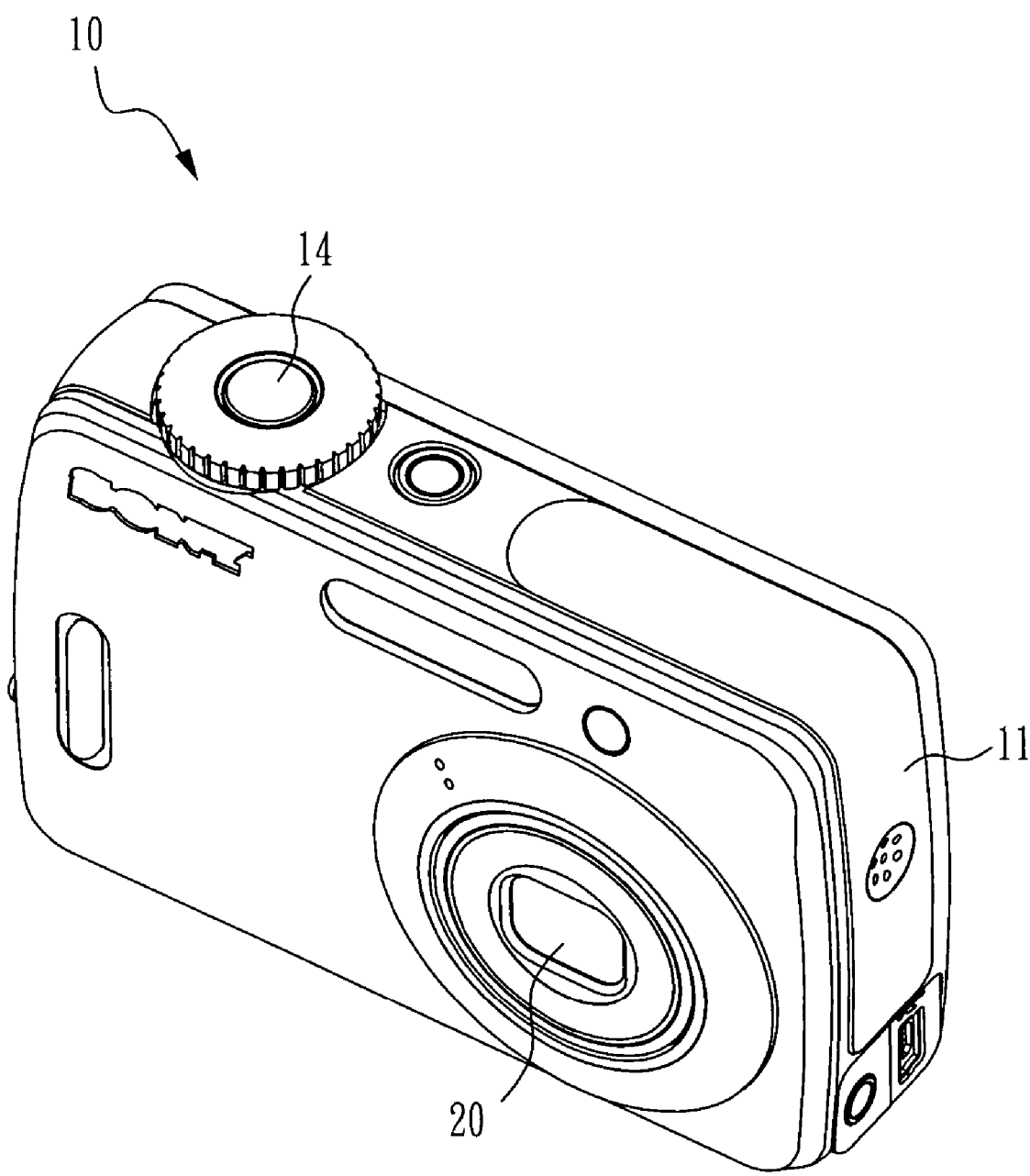
FIG. 3 is a perspective view of a digital camera according to the present invention.
Figure 4:
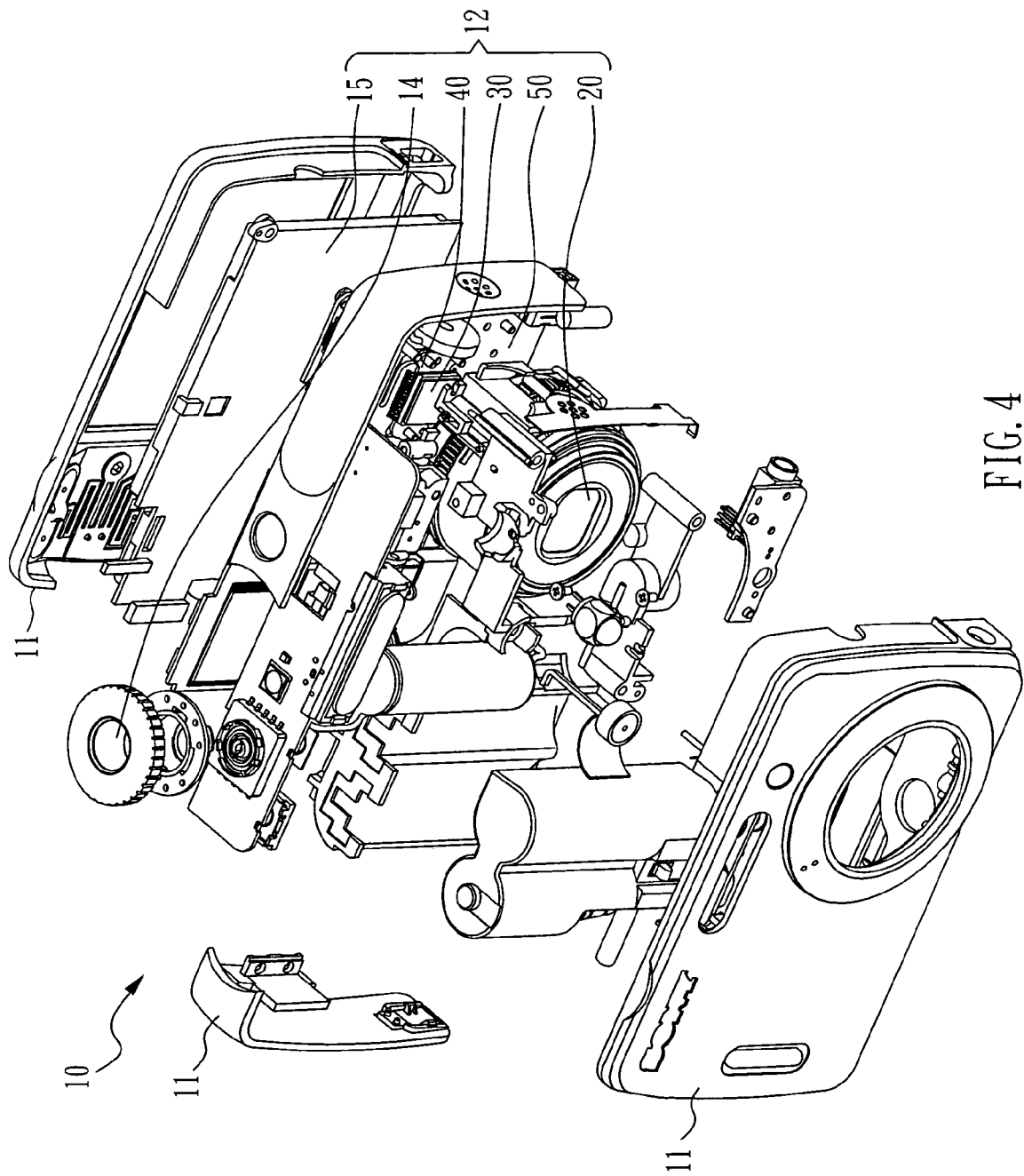
FIG. 4 is an exploded view of a digital camera according to the present invention.

Please refer to FIG. 3 and FIG. 4. FIG. 3 is a perspective view of a digital camera according to the present invention. FIG. 4 is an exploded view of a digital camera according to the present invention. A digital camera 10 comprises a case 11 and an image capturing control system 12. The image capturing control system 12 comprises an optical lens set 20, an optical sensor chip 30 (such as CCD or CMOS), a mounting seat 40, at least one control button 14, at least one circuit board 50 (the circuit board includes circuitry and electronic units) and a screen 15. Since the basic hardware structure of the digital camera 10 is a very well known technology, it requires no further description.

A characteristic of the present invention is the combination of the optical lens set 20, the optical sensor chip 30, the mounting seat 40 and the circuit board 50, with particular reference to the mechanism in the circuit board 50.

Figure 5:
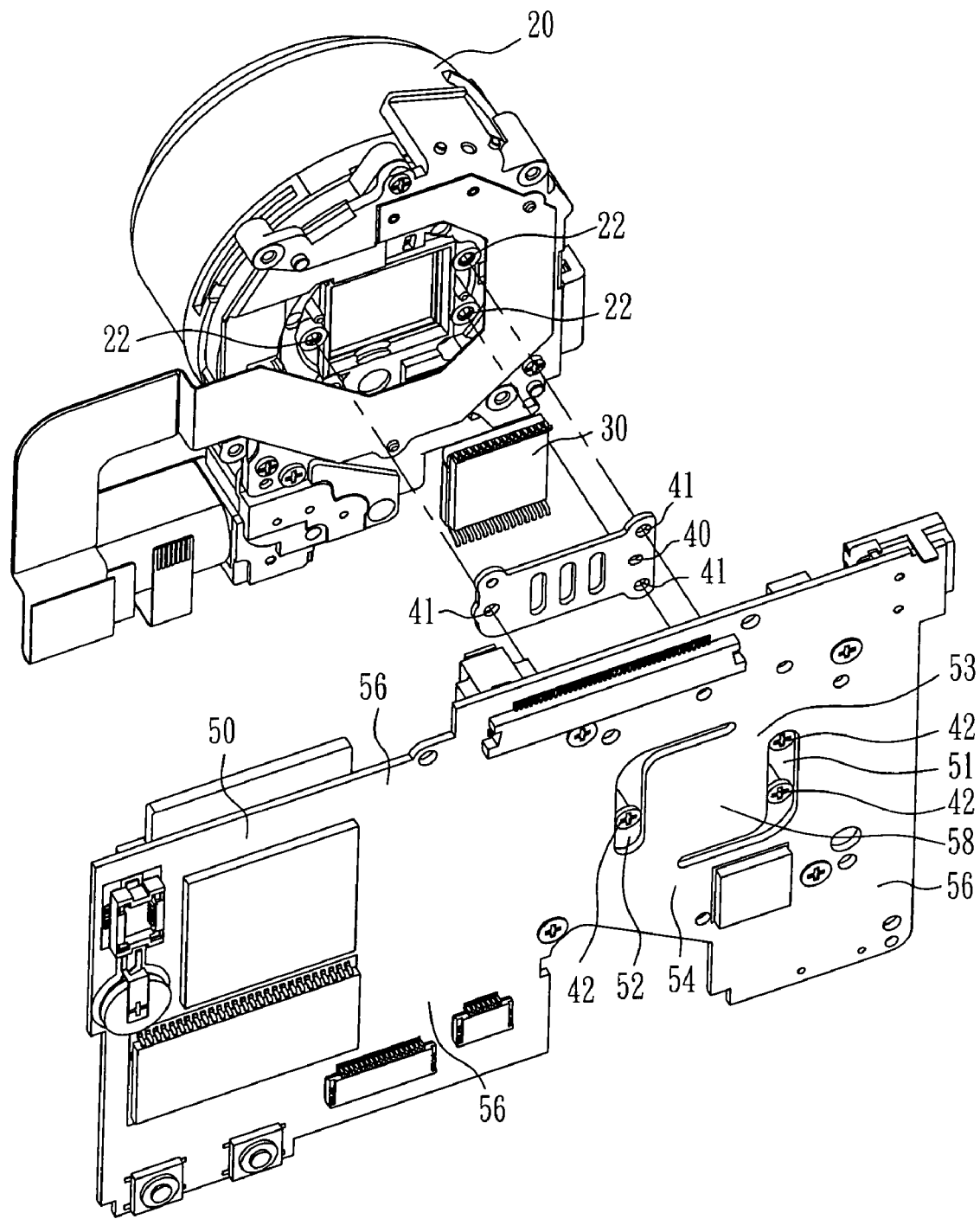
FIG. 5 is an exploded view of a first embodiment circuit board in a digital camera, which shows a combination of an optical lens set, an optical sensor chip, a mounting seat and the circuit board.
Figure 6:
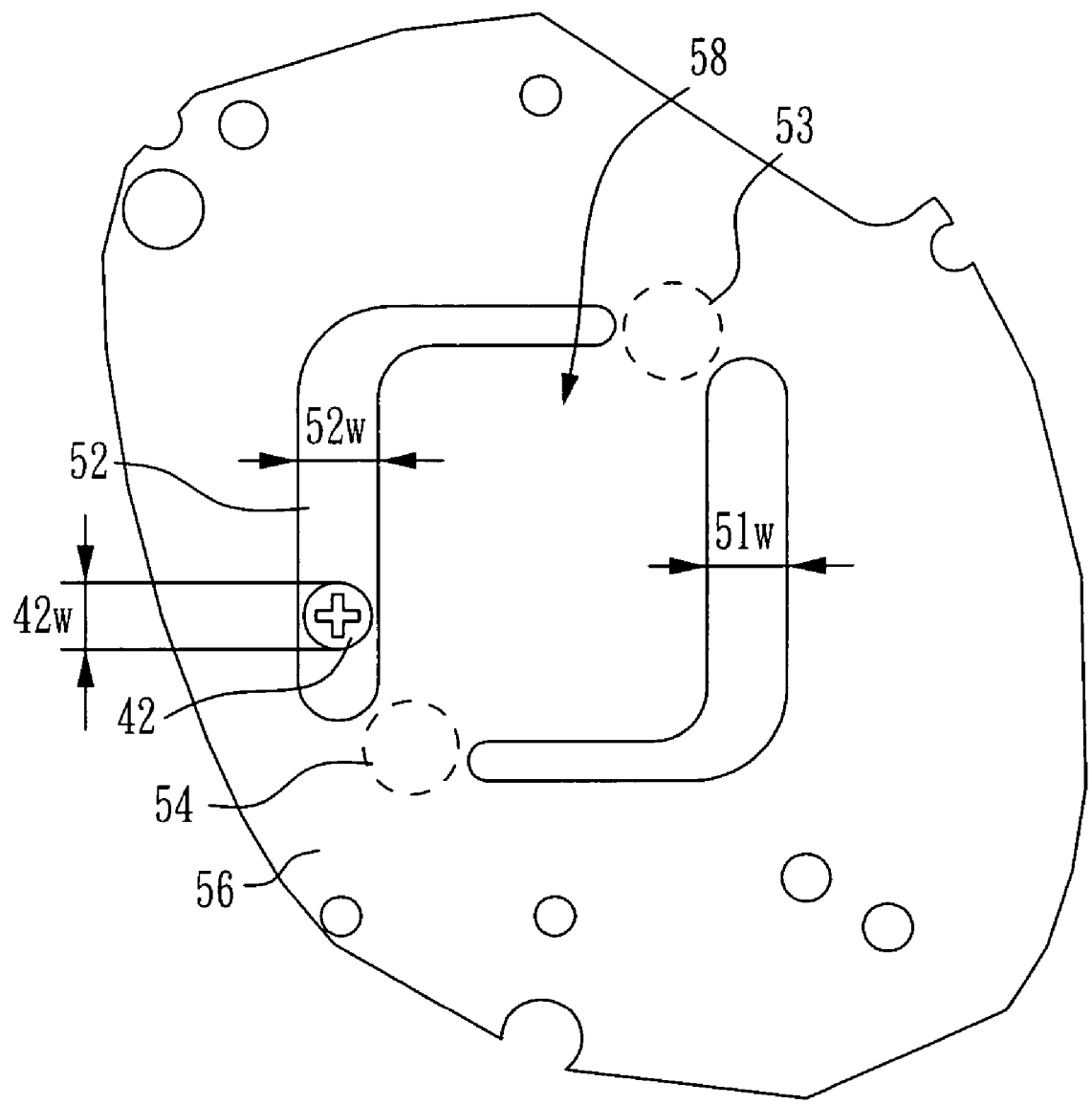
FIG. 6 is a schematic drawing showing fastening members and slots of the present invention.
Figure 7:
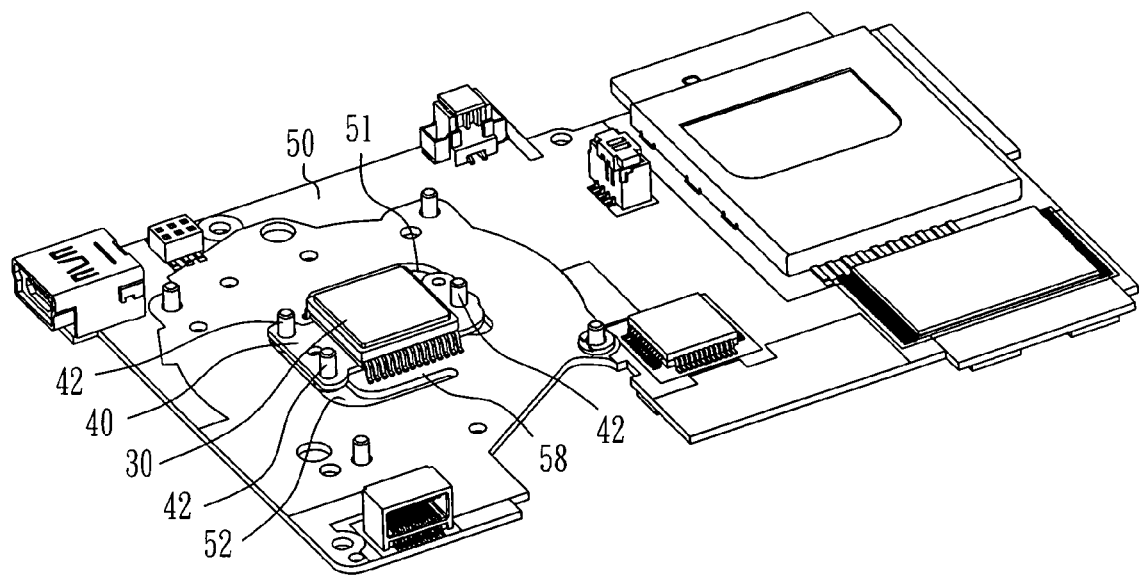
FIG. 7 is an exploded view of a first embodiment circuit board in a digital camera, which shows the combination of an optical sensor chip, a mounting seat and the circuit board.

Please refer to FIG. 5 to FIG. 7. The circuit board 50 of the present invention comprises a main area 56 and a flexible area 58. The flexible area 58 is surrounded by two L-shaped slots, a first slot 51 and a second slot 52, and also surrounded by a first connecting area 53 and a second connecting area 54 (the areas shown by the dashed lines in FIG. 6). The flexible area 58 is therefore connected to the main area 56 by the first connecting area 53 and the second connecting area 54. In a preferred embodiment, the first slot 51 and the second slot 52 are symmetric, and the first connecting area 53 and the second connecting area 54 are also symmetric. Furthermore, the first slot 51 and the second slot 52 surround 60%~97% (and preferably 70%~95%) of the periphery of the flexible area 58, and the first connecting area 53 and the second connecting area 54 surround 40%~3% (and preferably 30%~5%) of the periphery of the flexible area 58. The first slot 51 and the second slot 52 are disposed between the flexible area 58 and the main area 56; therefore the flexible area 58 is flexible relative to the main area 56.

The optical sensor chip 30 is fixed onto the flexible area 58, and the mounting seat 40 is disposed between the optical sensor chip 30 and the circuit board 50. A plurality of fastening members 42 (such as screws) are disposed in the first slot 51 and the second slot 52, and pass through a plurality of fastening holes 41 of the mounting seat 40 to lock with a plurality of locking holes on the optical lens set 20. Please refer to FIG. 6. The plurality of fastening members 42 are placed in the first slot 51 and the second slot 52 having respective widths 51w, 52w, which are larger than a largest width 42w of the fastening member 42. Therefore, the plurality of fastening members 42 are not connected to the first slot 51 or the second slot 52, and when the fastening members 42 are fastened to the optical lens set 20, the optical sensor chip 30 is connected parallel to the optical lens set 20 to ensure a high quality captured image.

Figure 8:
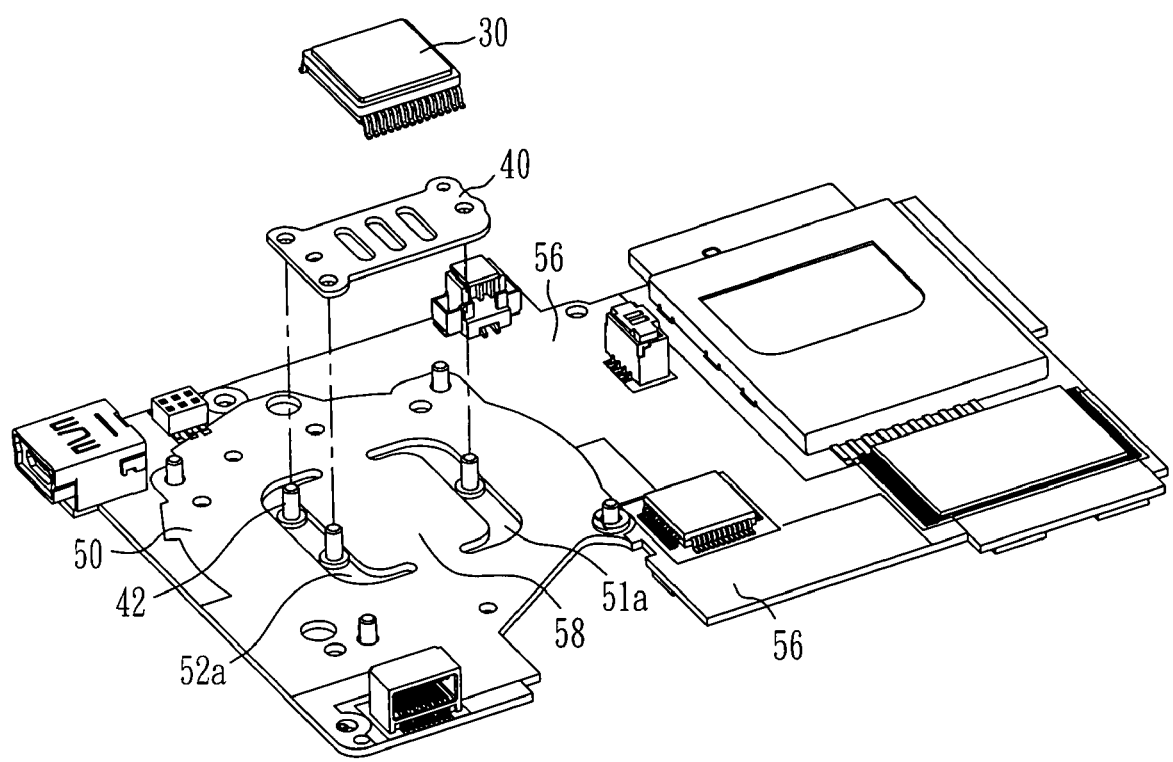
FIG. 8 is an exploded view of a second embodiment circuit board in a digital camera, which shows a combination of an optical sensor chip, a mounting seat and the circuit board.

Please refer to FIG. 8, an exploded view of a second embodiment of a circuit board in a digital camera, which shows the combination of the optical sensor chip, the mounting seat and the circuit board. The difference between the second embodiment and the first embodiment is that the first slot 51a and the second slot 52a are not only symmetric but U-shaped.

Because the circuit board 50 is connected to other elements, such as the case 11 and the optical lens set 20, the circuit board 50 generates stress (both during and after the assembly process). The present invention utilizes the first slot 51 and the second slot 52 to reduce the stress acting on the flexible area 58. Moreover, since the flexible area 58 can flex relative to the main area 56, though the circuit board 50 may have minor bends that generate stress (during and after the assembly process), the optical sensor chip 30 on the flexible area 58 remains in parallel connection with the optical lens set 20 via the mounting seat 40.

Although the present invention has been explained in relation to its preferred embodiment, it is to be understood that many other possible modifications and variations can be made without departing from the spirit and scope of the invention as hereinafter claimed.

What is claimed is:

1. A digital camera comprising: a case; and an image capturing control system having an optical lens set, an optical sensor chip and a circuit board, wherein the optical lens set and the optical sensor chip are fixed on the circuit board, and the optical sensor chip is disposed between the optical lens and the circuit board; the digital camera characterized in that: the circuit board comprises a main area and a flexible area, wherein the flexible area is connected to the main area and is capable of flexing relative to the main area; and the optical sensor chip is fixed to the flexible area;
   wherein the flexible area is surrounding by a plurality of slots and a plurality of connecting areas and the flexible area is connected to the main area with the plurality of connecting areas;
   wherein there are two slots and two connecting areas; and
   wherein the plurality of slots surround from 60% up to 97% of the periphery of the flexible area, and the plurality of connecting areas surround 40% down to 3% of the periphery of the flexible area.

2. The digital camera as claimed in claim 1, wherein the image capturing control system further comprises a mounting seat disposed between the optical sensor chip and the circuit board, and the mounting seat is connected to the optical lens set via a plurality of fastening members.

3. The digital camera as claimed in claim 1, wherein each slot is L-shaped.

4. The digital camera as claimed in claim 1, wherein each slot is U-shaped.

5. The digital camera as claimed in claim 1, wherein the slots are symmetric with respect to each other.

6. A digital camera comprising: a case; and an image capturing control system having an optical lens set, an optical sensor chip and a circuit board, wherein the optical lens set and the optical sensor chip are fixed on the circuit board, and the optical sensor chip is disposed between the optical lens and the circuit board; the digital camera characterized in that: the circuit board comprises a main area and a flexible area, wherein the flexible area is connected to the main area and is capable of flexing relative to the main area; and the optical sensor chip is fixed to the flexible area;
   wherein the flexible area is surrounding by a plurality of slots and a plurality of connecting areas and the flexible area is connected to the main area with the plurality of connecting areas;
   wherein there are two slots and two connecting areas; and
   wherein the plurality of slots surround 70% up to 95% of the periphery of the flexible area, and the plurality of connecting areas surround 30% down to 5% of the periphery of the flexible area.

7. The digital camera as claimed in claim 6, wherein the image capturing control system further comprises a mounting seat disposed between the optical sensor chip and the circuit board, and the mounting seat is connected to the optical lens set via a plurality of fastening members.

8. The digital camera as claimed in claim 6, wherein each slot is L-shaped.

9. The digital camera as claimed in claim 6, wherein each slot is U-shaped.

10. The digital camera as claimed in claim 6, wherein the slots are symmetric with respect to each other.

11. A digital camera comprising: a case; and an image capturing control system having an optical lens set, an optical sensor chip and a circuit board, wherein the optical lens set and the optical sensor chip are fixed on the circuit board, and the optical sensor chip is disposed between the optical lens and the circuit board; the digital camera characterized in that: the circuit board comprises a main area and a flexible area, wherein the flexible area is connected to the main area and is capable of flexing relative to the main area; and the optical sensor chip is fixed to the flexible area;
   wherein the image capturing control system further comprises a mounting seat disposed between the optical sensor chip and the circuit board, and the mounting seat is connected to the optical lens set via a plurality of fastening members;
   wherein the flexible area is surrounding by a plurality of slots and a plurality of connecting areas, and the flexible area is connected to the main area with the plurality of connecting areas;
   wherein the mounting seat comprises a plurality of fastening holes, and the plurality of fastening members are combined with the optical lens set via the plurality of fastening holes;
   wherein the plurality of fastening members are in the plurality of slots but not combined with the slots;
   wherein there are two slots and two connecting areas; and
   wherein the plurality of slots surround from 70% up to 95% of the periphery of the flexible area, and the plurality of connecting areas surround from 30% down to 5% of the periphery of the flexible area.

12. A digital camera comprising: a case; and an image capturing control system having an optical lens set, an optical sensor chip and a circuit board, wherein the optical lens set and the optical sensor chip are fixed on the circuit board, and the optical sensor chip is disposed between the optical lens and the circuit board; the digital camera characterized in that: the circuit board comprises a main area and a flexible area, wherein the flexible area is connected to the main area and is capable of flexing relative to the main area; and the optical sensor chip is fixed to the flexible area;

wherein the image capturing control system further comprises a mounting seat disposed between the optical sensor chip and the circuit board, and the mounting seat is connected to the optical lens set via a plurality of fastening members;

wherein the flexible area is surrounding by a plurality of slots and a plurality of connecting areas, and the flexible area is connected to the main area with the plurality of connecting areas;

wherein the mounting seat comprises a plurality of fastening holes, and the plurality of fastening members are combined with the optical lens set via the plurality of fastening holes;

wherein the plurality of fastening members are in the plurality of slots but not combined with the slots;

wherein there are two slots and two connecting areas; and wherein the plurality of slots surround from 60% up to 97% of the periphery of the flexible area, and the plurality of connecting areas surround from 40% down to 3% of the periphery of the flexible area.

13. The digital camera as claimed in claim 12, wherein each slot is symmetric with respect to the other slot.

14. The digital camera as claimed in claim 11, wherein each slot is symmetric with respect to the other slot.

* * * * *